(12) United States Patent
Bleeker et al.

(10) Patent No.: US 7,728,956 B2
(45) Date of Patent: Jun. 1, 2010

(54) LITHOGRAPHIC APPARATUS AND DEVICE MANUFACTURING METHOD UTILIZING MULTIPLE DIE DESIGNS ON A SUBSTRATE USING A DATA BUFFER THAT STORES PATTERN VARIATION DATA

(75) Inventors: Arno Jan Bleeker, Westerhoven (NL); Kars Zeger Troost, Waalre (NL); Adrianus Johannes Henricus Maas, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/098,607

(22) Filed: Apr. 5, 2005

(65) Prior Publication Data

US 2006/0221320 A1    Oct. 5, 2006

(51) Int. Cl.
*G03B 27/32* (2006.01)
(52) U.S. Cl. ......................................... 355/77
(58) Field of Classification Search .................. 355/53, 355/67, 77; 250/548; 430/5, 20, 30
See application file for complete search history.

(56) References Cited

U.S. PATENT DOCUMENTS

| 5,229,872 A | 7/1993 | Mumola |
| 5,296,891 A | 3/1994 | Vogt et al. |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |

(Continued)

FOREIGN PATENT DOCUMENTS

JP    2002-260981 A    9/2002

(Continued)

OTHER PUBLICATIONS

Wikipedia. "Integrated circuit." Nov. 15, 2007. http://en.wikipedia.org/wiki/Integrated_circuit.*

(Continued)

*Primary Examiner*—Edward J Glick
*Assistant Examiner*—Chia-how Michael Liu
(74) *Attorney, Agent, or Firm*—Sterne, Kessler, Goldstein & Fox P.L.L.C.

(57) ABSTRACT

A lithographic system and method are provided that allow for variations of a basic device design to be generated without substantially increasing the cost of the data path hardware. The lithographic apparatus includes an array of individually controllable elements, a control system, a first data buffer, and a second data buffer. The control system provides control signals to the array of individually controllable elements. The first data buffer stores pattern data that corresponds to a pattern to be exposed on a plurality of areas on the substrate. The second data buffer stores pattern variation data, corresponding to at least one change to a part of the pattern. The control system is configured, such that at least one variation of the pattern is exposed on one of the areas on the substrate with the pattern variation data.

20 Claims, 5 Drawing Sheets

U.S. PATENT DOCUMENTS

| | | |
|---|---|---|
| 6,312,134 B1 | 11/2001 | Jain et al. |
| 6,687,041 B1 | 2/2004 | Sandstrom |
| 6,707,534 B2 | 3/2004 | Bjorklund et al. |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,813,062 B2 | 11/2004 | Sandstrom |
| 6,833,908 B2 | 12/2004 | Markle |
| 6,844,920 B2 | 1/2005 | Luellau |
| 7,006,196 B2 * | 2/2006 | Schroeder .................... 355/53 |
| 7,009,753 B2 | 3/2006 | Sandstrom |
| 7,016,015 B2 * | 3/2006 | Bleeker ....................... 355/53 |
| 7,259,829 B2 | 8/2007 | Bleeker et al. |
| 2003/0077089 A1 * | 4/2003 | Luellau ..................... 399/130 |
| 2004/0041104 A1 | 3/2004 | Liebregts et al. |
| 2004/0130561 A1 | 7/2004 | Jain |
| 2005/0007572 A1 | 1/2005 | George et al. |
| 2006/0017903 A1 * | 1/2006 | Bleeker et al. ................ 355/67 |

FOREIGN PATENT DOCUMENTS

| | | |
|---|---|---|
| JP | 2004-128272 A | 4/2004 |
| WO | WO 98/33096 | 7/1998 |
| WO | WO 98/38597 | 9/1998 |

OTHER PUBLICATIONS

Wikipedia. "Integrated circuit." Aug. 21, 2004. http://web.archive.org/web/20040824090632/http://en.wikipedia.org/wiki/Integrated_circuit.*

Non-Final Rejection mailed Jun. 23, 2006 for U.S. Appl. No. 10/898,667 filed Jul. 26, 2004, 7 pgs.

Final Rejection mailed Dec. 6, 2006 for U.S. Appl. No. 10/898,667 filed Jul. 26, 2004, 7 pgs.

Notice of Allowance mailed Apr. 16, 2007 for U.S. Appl. No. 10/898,667 filed Jul. 26, 2004, 6 pgs.

Notification of Reasons for Refusal mailed Apr. 21, 2009 for Japanese Patent Application No. 2006-102617, 3 pgs.

Translation of Notification of Reasons for Refusal mailed Sep. 8, 2009 for Japanese Patent Application No. 2006-102617, 4 pgs.

* cited by examiner

LITHOGRAPHIC APPARATUS AND DEVICE MANUFACTURING METHOD UTILIZING MULTIPLE DIE DESIGNS ON A SUBSTRATE USING A DATA BUFFER THAT STORES PATTERN VARIATION DATA

BACKGROUND

1. Field

The present invention relates to a lithographic apparatus and a method for manufacturing a device.

2. Related Art

A lithographic apparatus is a machine that applies a desired pattern onto a substrate, usually onto a target portion of the substrate. A lithographic apparatus can be used, for example, in the manufacture of flat panel displays, integrated circuits (ICs), micro-electro-mechanical-systems (MEMS), and other devices involving fine structures. In a conventional apparatus, a contrast device or a patterning device, which can be referred to as a mask or a reticle, can be used to generate a circuit pattern corresponding to an individual layer of a flat panel display or other device. This pattern can be transferred onto a target portion (e.g., comprising part of one or several dies) on a substrate (e.g., a glass plate). Transfer of the pattern is typically via imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. Compared to mask-based system, the pattern can be changed more quickly and for less cost.

In general, a flat panel display substrate is rectangular in shape. Known lithographic apparatus designed to expose a substrate of this type typically provide an exposure region, which covers a full width of the rectangular substrate, or which covers a portion of the width (e.g., about half of the width). The substrate is scanned underneath the exposure region, while the mask or reticle is synchronously scanned through the beam. In this way, the pattern is transferred to the substrate. If the exposure region covers the full width of the substrate, then exposure is completed with a single scan. If the exposure region covers, for example, half of the width of the substrate, then the substrate is moved transversely after the first scan, and a second scan is performed to expose the remainder of the substrate.

Another way of imaging includes pixel grid imaging, in which a pattern is realized by successive exposure of spots.

When manufacturing devices using a lithographic process, more than one device can be formed on a substrate. For instance, the same patterns can be exposed at different locations on the substrate to form the features of each device. Subsequently, following the processing to form the devices, the substrate is divided to form the separate devices. In mask-based lithography, an area exposed on the substrate at each area is defined by the mask and therefore fixed. Accordingly, subject to variations caused by processing differences, the patterns exposed on each part of the substrate, and hence the features of each of the devices, are substantially identical for each of the devices formed on a substrate.

When performing a lithographic process using an apparatus that has an array of individually controllable elements, it is possible to expose different patterns on different portions of the substrate. However, the cost of a lithographic apparatus using an array of individually controllable elements can be significantly reduced if it is configured to expose an identical pattern in a plurality of areas on a substrate.

In a particular arrangement, a repeating pattern that is to be exposed on a substrate (which can correspond to the pattern to form a layer of the device to be formed on the substrate) can be divided into a plurality of stripes. During the exposure process, the substrate is scanned beneath the beam of radiation, which is patterned by the array of individually controllable elements to expose one of these pattern stripes in a first area on the substrate. The same stripe is then printed on each of the other areas on the substrate at which the device is to be formed. Once the pattern stripe has been printed at each location, the lithographic apparatus begins printing the next pattern stripe at each location. The benefit of such a system is that it reduces the cost of the processing hardware that is required to control the individually controllable elements in the patterning array.

In one example, the amount of data to define the pattern to be exposed on the substrate can be very large. Accordingly, it is conventionally stored in a vector-based format, which permits a considerable compression ratio compared to a bitmap format. In order to calculate the control signals to drive the array of individually controllable elements, the pattern data is converted into a format, such as a bitmap data format, and stored in a data buffer. This process, commonly referred to as 'rasterization,' is complicated and the rasterizer represents a significant portion of the cost of the lithographic apparatus. Accordingly, it is desirable to minimize the cost of the rasterizer. In one example, this can be achieved by selecting a rasterizer size (and hence speed at completing the rasterization process) such that it can just rasterize the data for the next stripe of the pattern to be printed during the time taken to print the preceding stripe on each of the areas on the substrate that the pattern is required. For example, if twenty identical devices are to be formed on one substrate, the rasterizer can be twenty times slower than it would be if each of the devices on the substrate were to be different. This is because the time provided for the rasterizer to rasterize the next stripe is the time taken to print twenty identical stripes on the substrate rather than the time taken to print a single stripe. The use of a slower rasterizer means that the rasterizer is cheaper, resulting in the cost savings of the lithographic apparatus referred to above. However, in order to achieve this cost saving, the apparatus is limited to providing a plurality of identical patterns on the substrate.

Therefore, what is needed is a system and method which are not limited to providing multiple identical versions of a same pattern on a substrate without significantly increasing the cost of the apparatus.

SUMMARY

According to one embodiment of the present invention, there is provided a lithographic apparatus comprising an array of individually controllable elements, a control system, a first data buffer, and a second data buffer. The control system provides control signals to the array of individually controllable elements. The first data buffer stores pattern data that corresponds to a pattern to be exposed on a plurality of areas on the substrate. The second data buffer stores pattern variation data, corresponding to at least one change to a part of the pattern. The control system is configured such that at least one variation of the pattern is exposed on one of the areas on the substrate with the pattern variation data.

According to one embodiment of the present invention, there is provided a lithographic apparatus comprising an array of individually controllable elements, a projection system, a control system, a first data buffer, and a second data buffer. The array of individually controllable elements modulates a radiation beam. The projection system projects the modulated radiation beam onto a target portion of a substrate. The control system provides control signals to the array of individually controllable elements. The first data buffer stores pattern data that corresponds to a pattern to be exposed on a plurality of areas on the substrate. The second data buffer stores pattern variation data, corresponding to at least one change to a part of the pattern. The control system is configured such that at least one variation of the pattern is exposed on one of the areas on the substrate with the pattern variation data.

According to one embodiment of the present invention, there is provided a lithographic apparatus comprising a device manufacturing method comprising the following steps. Modulating a beam of radiation using an array of individually controllable elements and projecting the beam of radiation onto a substrate. The control system is used to provide control signals to the array of individually controllable elements. Pattern data, corresponding to a pattern to be exposed on a plurality of areas on the substrate, is stored in a first data buffer. Pattern variation data, corresponding to at least one change to a part of the pattern, is stored in a second data buffer. The control system provides control signals to the array of individually controllable elements such that at least one variation of the pattern is exposed on one of the areas on the substrate in accordance with the pattern variation data.

Further embodiments, features, and advantages of the present inventions, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate one or more embodiments of the present invention and, together with the description, further serve to explain the principles of the one or more embodiments of the present invention and to enable a person skilled in the pertinent art to make and use the one or more embodiments of the present invention.

The present invention will now be described with reference to the accompanying drawings. In the drawings, like reference numbers can indicate identical or functionally similar elements.

DETAILED DESCRIPTION

Overview and Terminology

Figure 1:
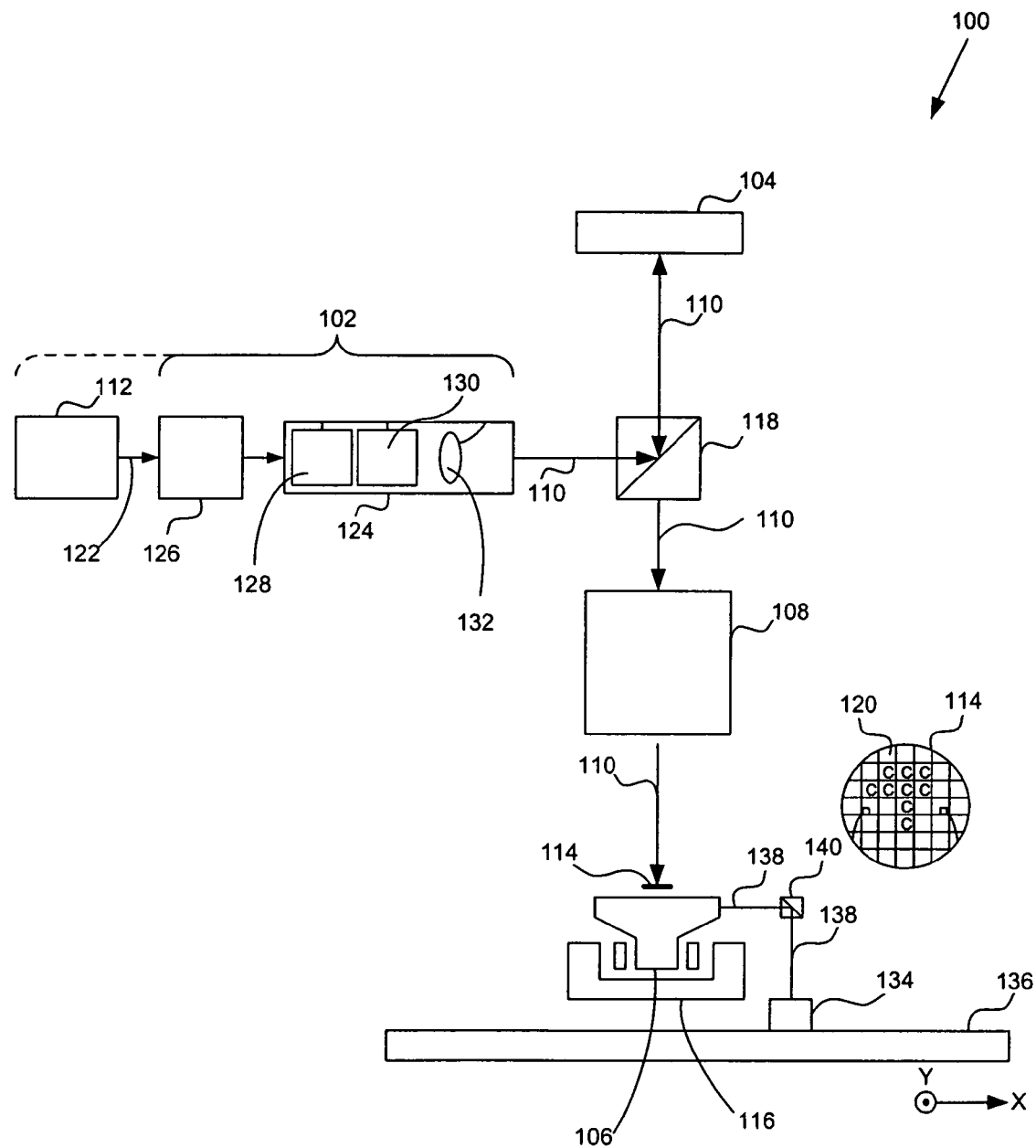
FIG. 1 depicts a lithographic apparatus, according to one embodiment of the present invention.

The use of "object," "substrate," "work piece," or the like are interchangeable in this application, and can be, but are not limited to, a work piece, a substrate (e.g., a flat panel display glass substrate), a wafer (e.g., a semiconductor wafer for integrated circuit manufacture), a print head, micro or nanofluidic devices, a display panel in a projection display system, or the like.

The terms "contrast device," "patterning device," "patterning array," or "array of individually controllable elements" used herein should be broadly interpreted as referring to any device that can be used to modulate the cross-section of a radiation beam such as to create a pattern in a target portion of a substrate (e.g., object). It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit. The terms "light valve" and "Spatial Light Modulator" (SLM) can also be used in this context. Examples of such patterning devices include:

A programmable mirror array. This can comprise a matrix-addressable surface having a viscoelastic (e.g., having viscous as well as elastic properties) control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the addressable surface.

It will be appreciated that, as an alternative, the filter can filter out the diffracted light, leaving the undiffracted light to reach the substrate.

An array of diffractive optical MEMS devices (Micro Electro-Mechanical Systems) can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The matrix addressing can be performed using suitable electronic means. Mirror arrays are described in, for example, U.S. Pat. Nos. 5,296,891 and 5,523,193, and PCT patent applications WO 98/38597 and WO 98/33096, which are incorporated herein by reference in their entireties.

The lithographic apparatus can comprise one or more patterning arrays. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements and a common projection system (or part of the projection system).

In one example (e.g., an embodiment depicted in FIG. 1) the substrate has a substantially circular shape, optionally with a notch and/or a flattened edge along part of its perimeter. In another example, the substrate has a polygonal shape, e.g., a rectangular shape.

In examples where the substrate has a substantially circular shape, the substrate can have various diameters, for example, but not limited to, at least 25 mm, at least 50 mm, at least 75 mm, at least 100 mm, at least 125 mm, at least 150 mm, at least 175 mm, at least 200 mm, at least 250 mm, or at least 300 mm. In various examples, the substrate has various diameters, for example, but not limited to, a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, at least one side, e.g., at least 2 sides or at least 3 sides, of the substrate have various lengths, for example, but not limited to, at least 5 cm, at least 25 cm, at least 50 cm, at least 100 cm, at least 150 cm, at least 200 cm, or at least 250 cm. In various examples, at least one side of the substrate has various lengths, for example, but not limited to, at most 1000 cm, at most 750 cm, at most 500 cm, at most 350 cm, at most 250 cm, at most 150 cm, or at most 75 cm. In an embodiment, the substrate is a rectangular substrate having a length of about 250-350 cm and a width of about 250-300 cm. The thickness of the substrate can vary and, to an extent, can depend, e.g., on the substrate material and/or the substrate dimensions.

In various examples, the substrate has various thicknesses, for example, but not limited to, at least 50 µm, at least 100 µm, at least 200 µm, at least 300 µm, at least 400 µm, at least 500 µm, or at least 600 µm. In various examples, the thickness of the substrate varies and is, for example, but not limited to, at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that, e.g., applies a layer of resist to a substrate and develops the exposed resist).

In one example, a resist layer is provided on the substrate. In one example, the substrate is a wafer, for instance a semiconductor wafer. In various examples, the wafer material can be, but is not limited to, Si, SiGe, SiGeC, SiC, Ge, GaAs, InP, and InAs. In one example, the wafer is a III/V compound semiconductor wafer. In one example, the wafer is a silicon wafer. In one example, the substrate is a ceramic substrate. In one example, the substrate is a glass substrate or a plastic substrate. Glass or plastic substrates can be useful, e.g., in the manufacture of flat panel displays and liquid crystal display panels. In one example, the substrate is transparent (e.g., for the naked human eye). In one example, the substrate is colored. In one example, the substrate is colorless.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. Any use of the term "projection lens" herein can be considered as synonymous with the more general term "projection system".

The projection system can image the pattern on the array of individually controllable elements such that the pattern is coherently formed on the substrate. Alternatively, the projection system can image secondary sources for which the elements of the array of individually controllable elements act as shutters. In this respect, the projection system can comprise an array of focusing elements, such as a micro lens array (known as an MLA) or a Fresnel lens array, e.g., to form the secondary sources and to image spots onto the substrate.

In one example, the array of focusing elements (e.g., MLA) comprises at least 10 focus elements, for example, but not limited to, at least 100 focus elements, at least 1000 focus elements, at least 10000 focus elements, at least 100000 focus elements, or at least 1000000 focus elements.

In one example, the number of individually controllable elements in the patterning device is equal to or greater than the number of focusing elements in the array of focusing elements.

In one example, the array of focusing elements comprises a focusing element that is optically associated with one or more of the individually controllable elements in the array of individually controllable elements, e.g., with 2 or more of the individually controllable elements in the array of individually controllable elements, such as, but not limited to, 3 or more, 5 or more, 10 or more, 20 or more, 25 or more, 35 or more, or 50 or more.

In one example, the array of focusing elements comprises more than one focusing element (e.g., more than 1000, the majority, or about all) that is optically associated with one or more of the individually controllable elements in the array of individually controllable elements. In an embodiment, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

As herein depicted in the figures below, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (e.g., dual stage) or more (e.g., multiple stage) substrate tables. In such "multiple stage" machines the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the contrast device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein can be considered as within the scope of the more general terms "substrate" or "target portion," respectively. The substrate referred to herein can be processed, before or after exposure, in for example a track (a tool that typically applies a layer of resist to a substrate and develops the exposed resist), a metrology tool and/or an inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate hereupon the resist is cured by applying electromagnetic radiation, heat, pressure or a combination thereof. The patterning device is moved out of the resist leaving a pattern in it after the resist is cured.

In another example, the invention can take the form of a computer program containing one or more sequences of machine-readable instructions describing a method as disclosed above, or a data storage medium (e.g., semiconductor memory, magnetic or optical disk) having such a computer program stored therein.

Exemplary Environment

FIG. 1 schematically depicts a lithographic projection apparatus 100, according to one embodiment of the present invention. Apparatus 100 includes at least a radiation system 102, an array of individually controllable elements 104 (e.g., a contrast device or patterning device), an object table 106 (e.g., a substrate table), and a projection system ("lens") 108.

Radiation system 102 can be used for supplying a beam 110 of radiation (e.g., UV radiation, 248 nm, 193 nm, 157 nm, EUV radiation, e.g., 10-13 nm, etc.), which in this particular case also comprises a radiation source 112. In one example, the radiation source provides radiation having a wavelength of at least 5 nm, for example, but not limited to, at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, for example, but not limited to, at most 425 nm, at most 375 nm, at most 360 nm, at most 325 nm, at most 275 nm, at most 250 nm, at most 225 nm, at most 200 nm, or at most 175 nm. In one example, the radiation has a wavelength including about 436 nm, 405 nm, 365 nm, 355 nm, 248 nm, 193 nm, 157 nm, 126 nm and/or 13.5 nm. In one example, the radiation includes a wavelength of around 365 nm or around 355 nm. In an embodiment, the radiation includes a broad band of wavelengths, for example encompassing 365, 405 and 436 nm. A 355 nm laser source could be used.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for positioning substrate 114 with respect to projection system 108.

Projection system 108 (e.g., a quartz and/or $CaF_2$ lens system or a catadioptric system comprising lens elements made from such materials or a mirror system) can be used for projecting the patterned beam received from a directing device 118 (e.g., a beam splitter).

Light is directed from directing device 118 onto a target portion 120 (e.g., one or more dies) of substrate 114. Projection system 108 can project an image of the array of individually controllable elements 104 onto substrate 114.

The illumination 124 can comprise an adjusting device 128 for setting the outer and/or inner radial extent (commonly referred to as (σ-outer and σ-inner, respectively) of the intensity distribution in beam 122. In addition, illuminator 124 will generally include various other components, for example a beam conditioner 126 (e.g., a beam expander). In this example, element 130 could be an integrator 130 and element 132 could be a condenser 132, compared to the example discussed above. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100. In alternative embodiments, source 112 can be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using directing device 118. In one example, the beam of radiation is directed at the patterning device at an angle between 0° and 90°, for example, but not limited to, between 5 and 85°, between 15 and 75°, between 25 and 65°, or between 35 and 55° (the embodiment shown in FIG. 1 is at a 90° angle). Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved, so as to position different target portions 120 in the path of beam 110. Where used, the positioning device (not shown) for the array of individually controllable elements 104 can be used to correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in a plurality of modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: similar to step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as between pulses of radiation system 102 and the pulses are timed such that successive target portions 120 are exposed at the locations on substrate 114. Consequently, patterned beam 110 can scan across substrate 114 to expose the complete pattern for a strip of substrate 114. The process is repeated until complete substrate 114 has been exposed line by line.

4. Continuous scan mode: similar to pulse mode except that a substantially constant radiation system 102 is used and the pattern on the array of individually controllable elements 104 is updated as patterned beam 110 scans across substrate 114 and exposes it.

In these first four exemplary modes, "partial coherent imaging" is typically performed for integrated circuit formation. Using this imaging, each element in an array of individually controllable elements has a unique tilt. The array is positioned at the object plane and the substrate is positioned at the image plane of the imaging projection optics. Various illumination modes can be applied: annular, conventional, quadrupole, dipole, etc. Also, different configurations for each element in an array of individually controllable elements can be used to increase the "negative black" values: phase step mirrors, applying larger tilts, shaping the mirrors (butterfly, H-shape), or the like.

Combinations and/or variations on the above described modes of use or entirely different modes of use can also be employed.

In lithography, a desired feature can be created on a substrate by selectively exposing a layer of resist on a substrate to radiation, e.g., by exposing the layer of resist to patterned radiation. Areas of the resist receiving a certain minimum light dose ("dose threshold") undergo a chemical reaction, whereas other areas remain unchanged. The created chemical differences in the resist layer allow for developing the resist, i.e., selectively removing either the areas having received at least the minimum dose or removing the areas that did not receive the minimum dose. As a result, part of the substrate is still protected by a resist, whereas the areas of the substrate from which resist is removed are exposed, allowing, e.g., for additional processing steps such as selective etching of the substrate, selective metal deposition, etc., thereby creating the desired feature.

Patterning the radiation can be effected by setting the individually controllable elements in a patterning device. This can allow for the radiation that is transmitted to an area of the resist layer on the substrate within the desired feature to be at a sufficiently high intensity. The can result in the area receiving a dose of radiation to be above the dose threshold during the exposure, whereas other areas on the substrate receive a radiation dose below the dose threshold by setting the corresponding individually controllable elements to provide a zero or significantly lower radiation intensity.

In one example, the radiation dose at the edges of the desired feature may not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose can drop off across a transition zone. The position of the boundary of the desired feature ultimately formed after developing the resist is then determined by the position at which the received dose drops below the radiation dose threshold. The profile of the drop-off of radiation dose across the transition zone, and hence the precise position of the feature boundary, can be controlled more precisely by setting the individually controllable elements that provide radiation to points on the substrate that are on or near the feature boundary not only to maximum or minimum intensity levels but also to intensity levels between the maximum and minimum intensity levels. This is commonly referred to as "grayscaling" or "grayleveling".

Grayscaling can provide greater control of the position of the feature boundaries than is possible in a lithography system in which the radiation intensity provided to the substrate by a given individually controllable element can only be set to two values (e.g., a maximum value and a minimum value). In one example, at least three different radiation intensity values can be projected onto the substrate, for example, but not limited to, at least 4 radiation intensity values, at least 8 radiation intensity values, at least 16 radiation intensity values, at least 32 radiation intensity values, at least 64 radiation intensity values, at least 100 radiation intensity values, at least 128 radiation intensity values, or at least 256 radiation intensity values. If the contrast device is a light source itself (e.g., an array of light emitting diodes or laser diodes), grayscaling can be affected, e.g., by controlling the intensity levels of the light being transmitted. If the contrast device is a micromirror device, grayscaling can be effected, e.g., by controlling the tilting angles of the micromirrors. Also, grayscaling can be effected by grouping a plurality of programmable elements in the contrast device and controlling the number of elements within the group that are switched on or off at a given time.

It should be appreciated that grayscaling can be used for additional or alternative purposes to that described above. For example, the processing of the substrate after the exposure can be tuned such that there are more than two potential responses of regions of the substrate, dependent on received radiation dose level. For example, a portion of the substrate receiving a radiation dose below a first threshold responds in a first manner, while a portion of the substrate receiving a radiation dose above the first threshold, but below a second threshold responds in a second manner, while a portion of the substrate receiving a radiation dose above the second threshold responds in a third manner. Accordingly, grayscaling can be used to provide a radiation dose profile across the substrate having more than two desired dose levels. In one example, the radiation dose profile has at least 2 desired dose levels, for example, but not limited to, at least 3 desired radiation dose levels, at least 4 desired radiation dose levels, at least 6 desired radiation dose levels, or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively, or additionally, be controlled by controlling the duration of the exposure of the point. As a further example, each point on the substrate can potentially receive radiation in a plurality of successive exposures. The radiation dose received by each point can, therefore, be alternatively, or additionally, controlled by exposing the point using a selected subset of the plurality of successive exposures.

In one example, in order to form the required pattern on the substrate, the individually controllable elements in the patterning device are set to the requisite state at the various stages of the exposure process. Therefore, control signals, representing the requisite states, are transmitted to the individually controllable elements. In one example, the lithographic apparatus includes a controller that generates the control signals. The pattern to be formed on the substrate can be provided to the lithographic apparatus in a vector-defined format, such as Graphic Design System II (GDSII). In order to convert the design information into the control signals for each individually controllable element, the controller includes one or more data manipulation devices configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

Figure 2:
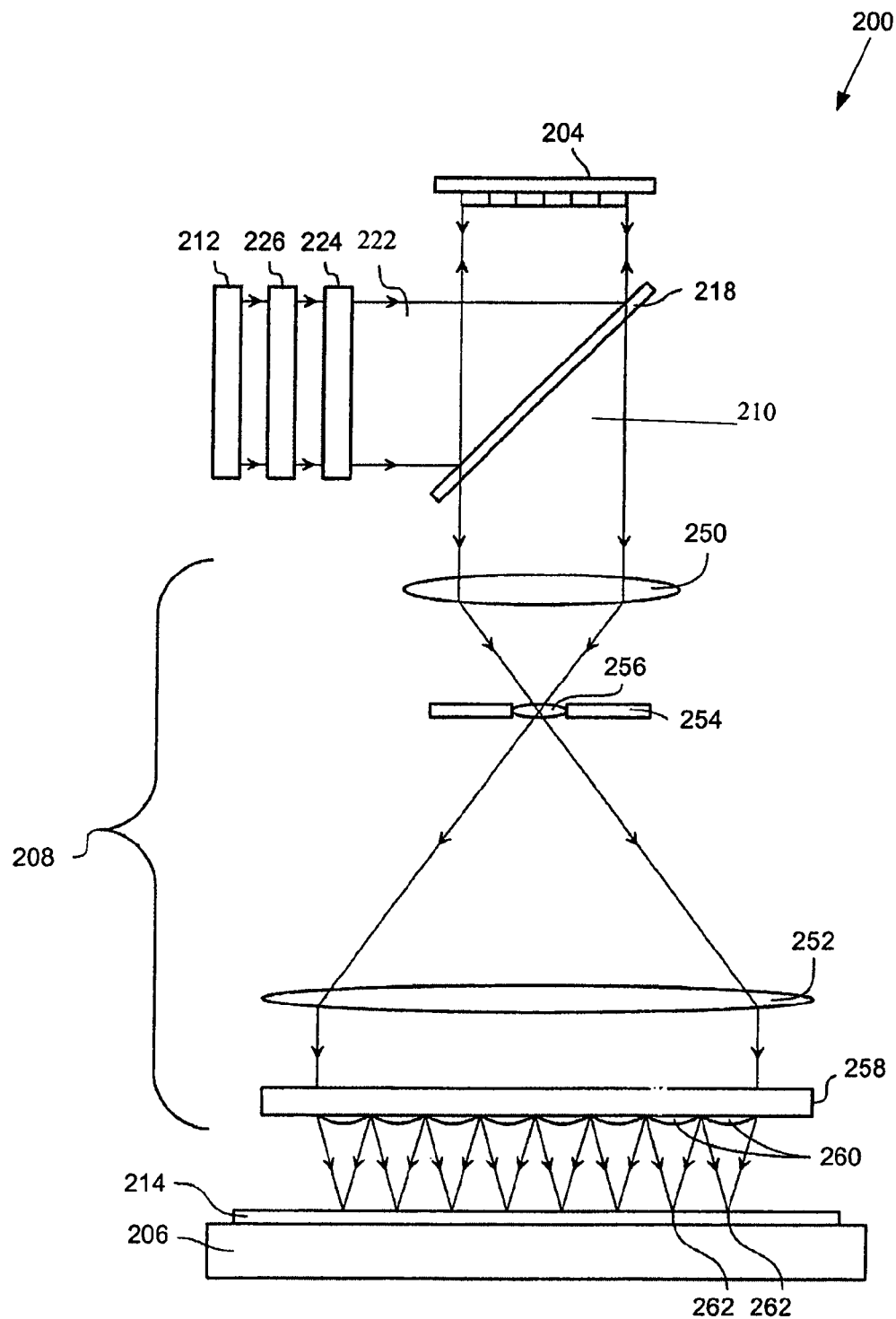
FIG. 2 depicts a lithographic apparatus that can be used, for example, in the manufacture of a flat panel display, according to one embodiment of the present invention.

FIG. 2 depicts a lithographic apparatus 200, according to one embodiment of the present invention. For example, apparatus 200 can be especially useful in the manufacture of flat panel displays using a pixel grid imaging mode, discussed below.

Projection system 208 can project images of secondary sources for which the elements of the array of individually controllable elements 204 act as shutters.

In an imaging grid array embodiment, projection system 208 can also comprise a micro lens array (MLA) to form the secondary sources and to project microspots onto substrate 214.

Source 212 (e.g., a frequency tripled Nd:YAG laser in pixel grid imaging mode or an excimer laser in other modes) can produce a beam of radiation 222. Beam 222 is fed into an illumination system (e.g., illuminator) 224, either directly or after having traversed conditioning device 226, such as a beam expander, for example.

In one example, when apparatus 200 is operating in a pixel grid imaging mode, discussed below, illuminator 224 can comprise an adjusting device for setting a zoom to adjust a spot size of beam 222. In addition, illuminator 224 will generally include various other components, such as a spot generator and a condenser. For example, the spot generator can be, but is not limited to, a refractive or diffractive grating, segmented mirrors arrays, waveguides, or the like. In this way, beam 210 impinging on the array of individually controllable elements 204 has a desired zoom, spot size, uniformity, and intensity distribution in its cross section.

As shown in FIG. 2, projection system 208 includes a beam expander, which comprises two lenses 250 and 252. First lens 250 is arranged to receive a modulated radiation beam 210 and focus it through an aperture in an aperture stop 254. In one example, a lens 256 is located in the aperture. Radiation beam 210 then diverges and is focused by second lens 252 (e.g., a field lens).

Projection system 208 further comprises an array of lenses 258 (e.g., a microlens array (MLA)) arranged to receive expanded modulated radiation 210. Different portions of the modulated radiation beam 210, corresponding to one or more of the individually controllable elements in a patterning or contrast device 204, pass through respective lenses 260 in MLA 258. Each lens 260 focuses the respective portion of the modulated radiation beam 210 to a point which lies on a substrate 214. In this way, an array of radiation spots 262 are exposed onto substrate 214. Although only eight lenses 260 are shown, MLA 258 can comprise many thousands of lenses, which is also true of a number of individually controllable elements in the array of individually controllable elements used as patterning or contrast device 204.

The system in FIG. 2 allows for another mode of operation, Pixel Grid Imaging Mode. In this mode the pattern formed on substrate 214 is realized by subsequent exposure of spots formed by spot generator 130 that are directed onto array 204. The exposed spots have substantially the same shape. On substrate 214 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

In one example, using this mode, which is typically used for formation of flat panel displays, individually controllable elements can be grouped into super-pixels. One super-pixel modulates the light of one spot at the substrate. The superpixel is imaged at the entrance of an MLA in the exit pupil of each spot printed. The spot shape can be influenced by the illuminator through use of spot defining element (e.g., spot generators), zoom of blazing functions, or the like.

Figure 3:
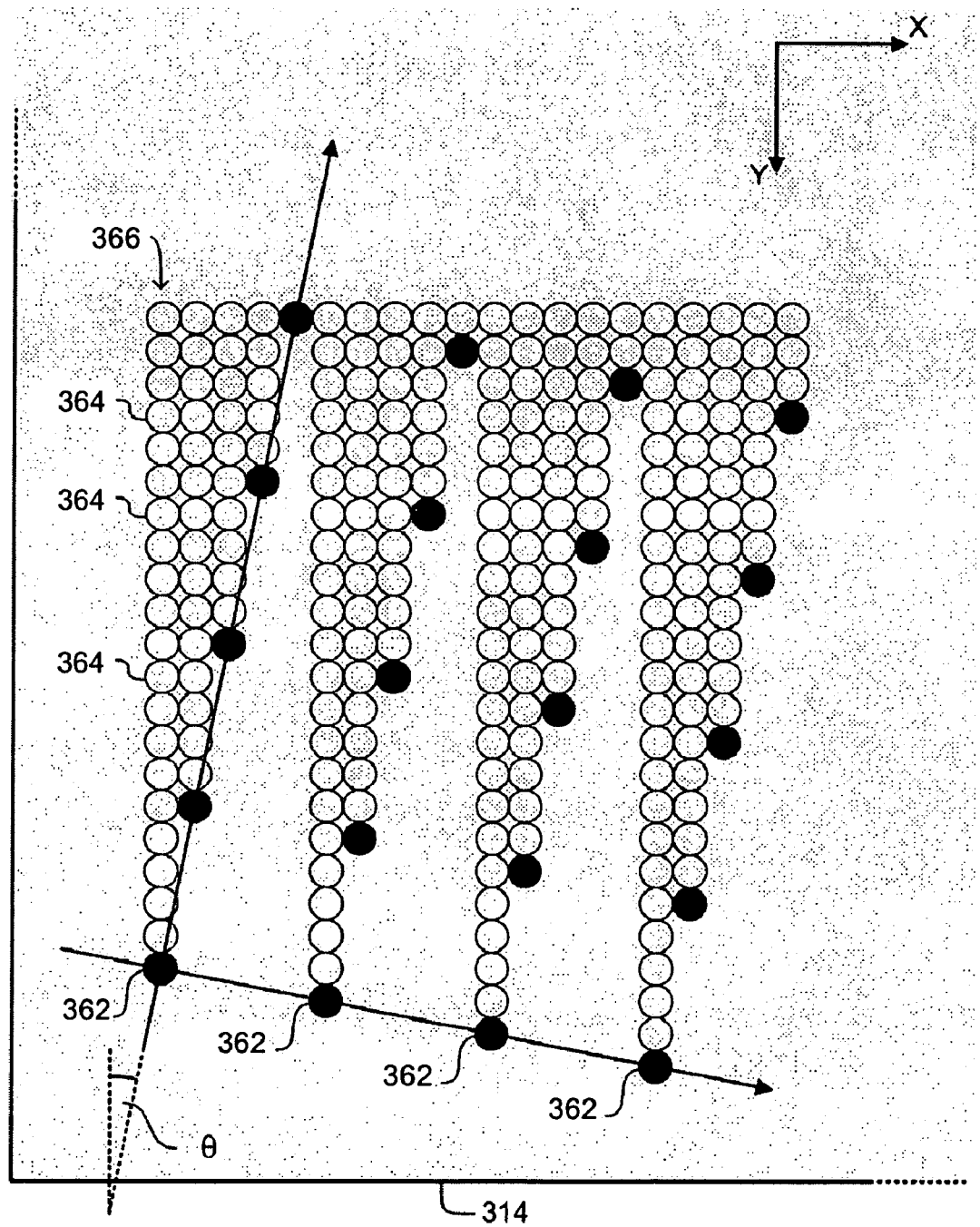
FIG. 3 depicts a mode of transferring a pattern to a substrate using a lithographic apparatus, according to one embodiment of the present invention.

FIG. 3 illustrates schematically how a pattern on a substrate 314 is generated, according to one embodiment of the present invention. For example, this embodiment can be performed using the pixel grid imaging mode discussed above.

The darkened circles 362 represent spots recently projected onto substrate 314 by a MLA in a projection system, for example the projection system as shown in FIG. 2. Substrate 314 is moved relative to the projection system in a Y direction as a series of exposures are exposed on substrate 314.

The open circles 364 represent spots that have previously been exposed on substrate 314. As shown, each spot 362 projected onto substrate 314 using the array of lenses within the projection system exposes a row 366 of spot exposures 362/364 on substrate 314. The complete pattern for substrate 314 is generated by the sum of all the rows 366 of spot exposures 364 exposed by each of the spots 362. Such an arrangement is commonly referred to as "pixel grid imaging," which was discussed above.

It can be seen that the array of radiation spots 362 is arranged at an angle θ relative to substrate 314 (i.e., when the edges of the substrate 314 lie parallel to the X and Y directions). This is done so that when substrate 314 is moved in a scanning direction (e.g., the Y-direction), each radiation spot 362 will pass over a different area of substrate 314, thereby allowing the entire substrate to be covered by the array of radiation spots. It will be appreciated that for ease of illustration the angle θ is exaggerated in FIG. 3. In one example, the angle θ is, for example, but not limited to, at most 20° or 10°, for instance at most 5°, at most 3°, at most 1°, at most 0.5°, at most 0.25°, at most 0.10°, at most 0.05°, or at most 0.01°. In an embodiment, the angle θ is, for example, but not limited to, at least 0.0001°, e.g., at least 0.001°.

It is to be appreciated that although 5×5 spots are shown in between two neighboring spots of the MLA, in one example up to about 100×100 spots can be used.

In one example, a spot grid at a substrate is about half a minimum linewidth to be printed (e.g., from about 0.1 microns up to a few microns), while a spot pitch at a MLA is about 100 micrometers up to about a few hundred micrometers.

Figure 4:
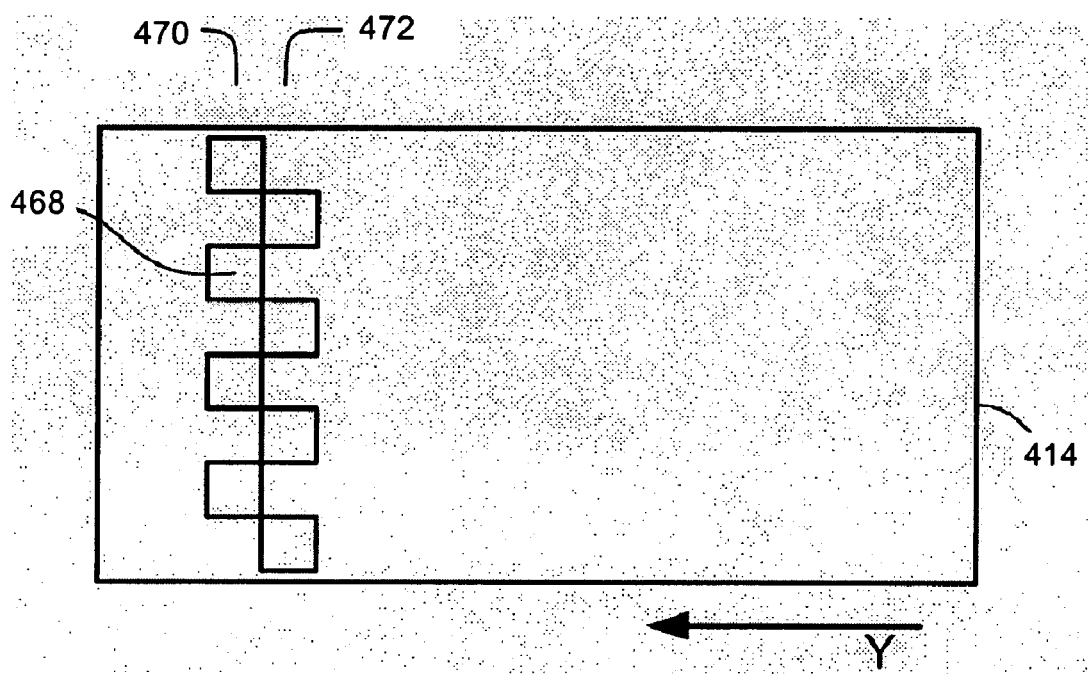
FIG. 4 depicts an arrangement of optical engines for exposing a pattern on a substrate, for example, used to manufacture a flat panel display, according to one embodiment of the present invention.

FIG. 4 shows schematically how an entire flat panel display substrate 414 is exposed in a single scan through use of a plurality of optical engines, according to one embodiment of the present invention. Eight arrays 468 of radiation spots are produced by eight optical engines (not shown), arranged in two rows 470,472 in a "chess board" configuration, such that the edge of one array of radiation spots slightly overlaps (e.g., in the scanning direction Y) with the edge of the adjacent array of radiation spots. In this example, a band of radiation extends across a width of substrate 414, allowing exposure of the entire substrate to be performed in a single scan. It will be appreciated that any suitable number of optical engines can be used. In one example, the number of optical engines is, for example, but not limited to, at least 1, at least 2, at least 4, at least 8, at least 10, at least 12, at least 14, or at least 17. In one example, the number of optical engines is less than 40, for example, but not limited to, less than 30 or less than 20.

In one example, each optical engine can comprise a separate illumination system, patterning device, and/or projection system, as described above. It is to be appreciated, however, that two or more optical engines can share at least a part of one or more of the illumination system, patterning device, and projection system.

Figure 5:
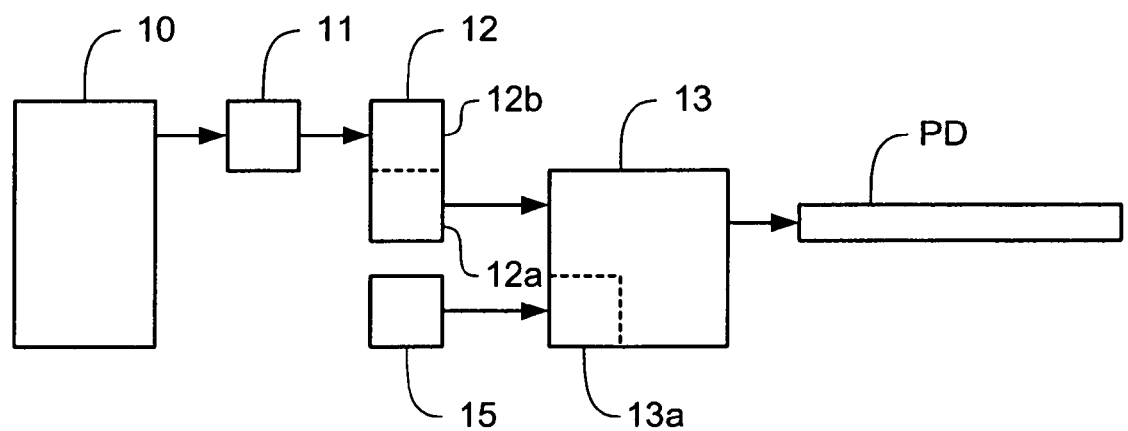
FIG. 5 depicts a system for generating control signals for patterning arrays, according to one embodiment of the present invention.

FIG. 5 schematically represents a system, according to one embodiment of the present invention. The system can be used for generating the signals to control the array of individually controllable elements of patterning device 104/204. As shown, the system includes a pattern data store 10, a rasterizer 11, a data buffer 12, and a signal generator 13. Pattern data in a vector-based format can be stored in pattern data store 10. Rasterizer 11 can be used for converting data from the pattern data store 10 into bitmap-type format data, representing a portion of a repeating pattern to be exposed on a plurality of areas on the substrate. Data buffer 12 stores the bitmap-type pattern data generated by the rasterizer 11. The control signal generator 13 generates the control signals to drive the array of individually controllable elements in patterning device 104/204, based on the bitmap-type data in the data buffer 12. It will be appreciated that the data buffer 12 can include a first portion 12a containing data presently being used to generate control signals in order to print a pattern stripe and a second portion 12b in which bitmap-type data is received from the rasterizer 11. Once the exposure of a given stripe has been completed (and the rasterizer has completed rasterizing the subsequent stripe), the roles of the first and second parts 12a, 12b of the data buffer 12 are reversed.

As shown in FIG. 5, the system further includes a second data buffer 15. The second data buffer 15 stores pattern variation data. The pattern variation data is used by the control signal generator 13 when generating the control signals to expose the repeating pattern on at least one of the areas on the substrate. Accordingly, the pattern exposed on some areas of the substrate is identical to the pattern defined by the pattern data held in the pattern data store 10, but the pattern printed at other areas is different. Consequently, on a single substrate it is possible to produce some devices according to a first design and, at the same time, produce other devices having a somewhat different design. This enables devices according to two or more designs to be quickly generated in order to determine which design is optimal.

For example, in the manufacture of integrated circuit devices, it is difficult to simulate the effect of different arrangements of lines within the device. With the system, devices with different arrangements of lines can be relatively quickly manufactured and tested to determine which arrangement is optimal. In one example, the present system allows non-identical devices to be formed on a single substrate, while not requiring an increase in the size (and hence the cost) of the rasterizer 11. In this example, instead a second data buffer 15 is added. The size of the second data buffer can vary and depend, e.g., on the extent to which variations in the pattern are to be allowed. If only relatively small design changes are to be tested, the second data buffer can be relatively small.

Although the data buffer 12 storing the rasterized pattern data and the data buffer 15 storing the pattern variation data are shown in FIG. 5 as separate data buffers, it will be appreciated that a single combined data buffer storing both sets of data could also be used. In such a case, the distribution of the data buffer between rasterized pattern data and the pattern variation data can be fixed or can be variable and set according to the situation. Any embodiment of physical and/or virtual memory mapping schemes can be employed.

In one example, the pattern variation data can be in the form of additional bitmap-type pattern data that is used to replace a portion of the pattern data stored in the data buffer 12 when the control signal generator 13 is generating the control signals for the exposure of one or more of the areas on the substrate.

Alternatively, or additionally, the control signal generator can include a pattern modifier 13a that modifies the pattern data provided from the pattern data buffer 12 according to an algorithm (or simply information) defined by modification instructions stored in the pattern variation buffer 15. For example, the modification algorithm can include derivative filtering or integral filtering to sharpen or smoothen the boundaries of pattern features, respectively.

Alternatively, or additionally, the algorithm can be configured to adjust the width of lines within a pattern. For example, the algorithm is configured such that the variations to the pattern can be applied to all of the pattern uniformly in differing amounts for different parts of the pattern. Furthermore, the algorithm can be configured such that it is directional, namely different adjustments are made to pattern features or pattern feature boundaries that are orientated at different angles.

In one example, the repeating portion of the pattern being exposed on the substrate can be one of the stripes of the pattern to form each of the devices on the substrate in a lithographic system as described in the introduction. Accordingly, the pattern stripe is exposed as many times as there are devices being formed on the substrate. The pattern for one or more of the stripes for these devices can be changed according to the pattern variation data stored in the second data buffer 15.

In another example, instead of stripes of a pattern corresponding to individual devices to be formed on a substrate, the repeating portions of the pattern stored in the pattern data buffer 12 and exposed at a plurality of locations on the substrate (in some cases as defined by the pattern in the pattern data store and in other cases as modified by the pattern variation data), can correspond to a functional component of the device or devices being formed on the substrate. For example, in the manufacture of flat panel displays, the repeating unit of the pattern can be the pattern corresponding to a single pixel in the flat panel display (which can be repeated many thousands of times in each device). Accordingly, using the system, it is possible to produce one or more flat panel displays on a single substrate in which slight modifications of the design for each pixel are produced. As before, it is then possible to determine which design is optimal. A corresponding arrangement can be used in the manufacture of integrated circuit devices. For example, in integrated circuit devices including memory (such as DRAM integrated circuits), the repeating unit of the pattern can be portions of memory (such as DRAM cells).

The pattern variation data can define the pattern modifications to generate a single modification of the pattern formed on the substrate. Alternatively, however, the pattern variation data can define more than one variation together with instructions for the control signal generator 13 to use the different variations at respective different locations on the substrate (for example in the formation of different devices on the substrate). Accordingly, it becomes possible to test a plurality of device designs by exposing and processing a single substrate. Accordingly, the cost of testing different device designs and therefore the development cost of the device can be significantly reduced.

The system provides variations of device designs can be used, e.g., as part of a test run prior to full scale production of the device. In other words, once the optimal design has been determined using the system of the present invention, full scale production of the device commences using the optimized design. Accordingly, it becomes possible to test a plurality of device designs by exposing and processing a single substrate. Therefore, the cost of testing different device designs and therefore the development costs of the device can be significantly reduced. Alternatively or additionally, small variations of the design can be tested during the production run of the device. In such a system, the pattern variations that are tested are sufficiently small that the number of resulting devices that are considered to be below an acceptable standard (and are therefore scrapped) does not become unacceptably high but an incremental optimization of the design whilst production is ongoing is possible.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A device manufacturing method, comprising:
    modulating a beam of radiation using an array of individually controllable elements, wherein a control system is used to provide control signals to the array of individually controllable elements;
    storing pattern data in a first buffer, wherein the pattern data corresponds to a first device to be exposed on the substrate;
    providing the control signals to the array of individually controllable elements, such that the beam of radiation is modulated by the pattern data;
    projecting the modulated beam of radiation onto a substrate to expose the first device on the substrate;
    storing in a second data buffer pattern variation data corresponding to at least one change to a part of the pattern data stored in the first data buffer;
    modifying the pattern data of the first data buffer using the pattern variation data of the second data buffer to generate modified pattern data, which corresponds to a second pattern of a second device to be exposed on the substrate;
    providing the control signals to the array of individually controllable elements, such that the beam of radiation is modulated by;
    projecting the modulated beam of radiation onto the substrate to expose the second device on the substrate; and
    testing the first and the second devices to determine an optimal pattern for a device.

2. The method of claim 1, wherein the first and second data buffers are independent data buffers.

3. The method claim 1, wherein the first and second data buffers are allocated portions of a combined data buffer.

4. The method claim 1, wherein the modifying comprises replacing part of the pattern data stored in the first data buffer with at least a portion of the pattern variation data.

5. The method claim 1, wherein:
the pattern variation data comprises modification instructions; and
the modifying comprises:
modifying the pattern data stored in the first data buffer according to information defined by the modification instructions.

6. The method of claim 1, wherein the projecting the modulated beam of radiation onto the substrate to expose the first device on the substrate comprises:
projecting the modulated beam of radiation onto the substrate to expose a pixel or a memory cell on the substrate.

7. The method of claim 1, wherein:
the pattern variation data comprises a plurality of pattern stripes to be exposed by a series of successive exposures; and
the projecting the modulated beam of radiation onto the substrate to expose the second device on the substrate comprises:
consecutively projecting the modulated beam of radiation onto the substrate to expose the plurality of pattern stripes at each area of the plurality of areas of the substrate on which the first device is to be exposed.

8. A computer program product comprising a computer useable medium having a computer program logic recorded thereon for controlling at least one processor, the computer program logic comprising:
computer program code means for modulating a beam of radiation using an array of individually controllable elements, wherein a control system is used to provide control signals to the array of individually controllable elements;
computer program code means for storing pattern data in a first buffer, wherein the pattern data corresponds to a first pattern of a first device to be exposed on a plurality of areas on the substrate;
computer program code means for storing pattern variation data corresponding to at least one change to a part of the pattern data in the first data buffer;
computer program code means for modifying the pattern data of the first data buffer using the pattern variation data of the second data buffer to generate modified pattern data, which corresponds to a second pattern of a second device to be exposed on the substrate;
computer program code means for providing control signals to the array of individually controllable elements, such that patterned beams corresponding to the first device and the second device are formed;
computer program code means for causing the patterned beams to be projected onto a substrate to expose the first device and the second device on respective areas on the substrate; and
computer program code means for testing the first and the second devices to determine an optimal pattern for a device.

9. The computer program product of claim 8, wherein the first and second data buffers are independent data buffers.

10. The computer program product of claim 8, wherein the first and second data buffers are allocated portions of a combined data buffer.

11. The computer program product of claim 8, wherein the computer program code means for modifying comprises computer program code means for replacing part of the pattern data stored in the first data buffer with at least a portion of the pattern variation data.

12. The computer program product of claim 8, wherein:
the pattern variation data comprises modification instructions; and
the computer program code means for modifying comprises:
computer program code means for modifying the pattern data stored in the first data buffer according to information defined by the modification instructions.

13. The computer program product of claim 8, wherein the computer program code means for causing the patterned beams to be projected comprises:
computer program code means for causing the pattern beams to be projected onto the substrate to expose a pixel or a memory cell on the substrate.

14. The computer program product of claim 8, wherein:
the pattern variation data comprises a plurality of pattern stripes to be exposed by a series of successive exposures; and
the computer program code means for causing the patterned beams to be projected comprises:
computer program code means for causing the pattern beams to be consecutively projected onto the substrate to expose the plurality of pattern stripes at each area of the plurality of areas of the substrate on which the first device is to be exposed.

15. A process, comprising:
controlling an array of individually controllable elements, wherein the controlling is performed through using,
pattern data corresponding to a first pattern of a first device to be exposed on a plurality of areas on a substrate, the pattern data being stored in a first data buffer; and
pattern variation data corresponding to at least one change to a part of the pattern data used to form a second device, the pattern variation data being stored in a second data buffer;
exposing the first device and the second device on respective areas of a substrate; and
testing the first and the second devices to determine an optimal pattern for a device.

16. The process of claim 15, wherein the first and second data buffers are independent data buffers.

17. The process of claim 15, wherein the first and second data buffers are allocated portions of a combined data buffer.

18. The process of claim 15, wherein the controlling comprises replacing part of the pattern data stored in the first data buffer with at least a portion of the pattern data.

19. The process of claim 15, wherein:
the pattern variation data comprises modification instructions; and
the controlling comprises:
modifying the pattern data stored in the first data buffer according to information defined by the modification instructions corresponding to the pattern variation data for the exposure of the second device on the substrate.

20. The process of claim 15, wherein:
the pattern variation data comprises a plurality of pattern stripes to be exposed by a series of successive exposures; and
the exposing comprises:
consecutively projecting the modulated beam of radiation onto the substrate to expose the plurality of pattern stripes at each area of the plurality of areas of the substrate on which the first device is to be exposed.

* * * * *